(12) United States Patent
Nakazawa et al.

(10) Patent No.: US 9,081,243 B2
(45) Date of Patent: Jul. 14, 2015

(54) TFT SUBSTRATE, METHOD FOR PRODUCING SAME, AND DISPLAY DEVICE

(75) Inventors: Makoto Nakazawa, Osaka (JP); Mitsunobu Miyamoto, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/127,844

(22) PCT Filed: Jun. 15, 2012

(86) PCT No.: PCT/JP2012/065341
§ 371 (c)(1),
(2), (4) Date: Dec. 19, 2013

(87) PCT Pub. No.: WO2012/176702
PCT Pub. Date: Dec. 27, 2012

(65) Prior Publication Data
US 2014/0125907 A1    May 8, 2014

(30) Foreign Application Priority Data
Jun. 22, 2011 (JP) ................. 2011-138638

(51) Int. Cl.
G02F 1/1368 (2006.01)
G02F 1/1345 (2006.01)
H01L 27/12 (2006.01)
G02F 1/1343 (2006.01)
G02F 1/1362 (2006.01)

(52) U.S. Cl.
CPC ...... *G02F 1/13439* (2013.01); *G02F 1/136213* (2013.01); *G02F 1/136227* (2013.01); *H01L 27/124* (2013.01); *H01L 27/1225* (2013.01); *H01L 27/1259* (2013.01)

(58) Field of Classification Search
CPC .............. G02F 1/13439; G02F 1/1368; H01L 27/1259; H01L 27/124; H01L 27/1225
USPC .......... 349/38, 43, 139, 149, 187; 257/43, 72; 430/321; 438/30, 155, 158
See application file for complete search history.

(56) References Cited

U.S. PATENT DOCUMENTS 6,330,303 B1 * 12/2001 Yamane et al. ............... 378/98.8
2001/0013577 A1 * 8/2001 Choo et al. ............... 250/370.09
2007/0080349 A1    4/2007 Hoshino et al.
2010/0079695 A1 * 4/2010 Um et al. ........................ 349/43

FOREIGN PATENT DOCUMENTS

JP    2006-330471 A    12/2006
JP    2008-180807 A    8/2008

* cited by examiner

*Primary Examiner* — Dung Nguyen
*Assistant Examiner* — Tai Duong
(74) *Attorney, Agent, or Firm* — Chen Yoshimura LLP

(57) ABSTRACT

A TFT substrate (100) is provided with TFTs disposed on a substrate (2), first insulating layers (24, 26) disposed above the TFTs, a lower layer transparent electrode (12) disposed above the first insulating layers (24, 26), a second insulating layer (28) covering the lower layer transparent electrode (12), and pixel electrodes (10) disposed on the second insulating layer (28), in which an auxiliary capacitance (Cs) is formed by means of the lower layer transparent electrode (12), the second insulating layer (28), and the pixel electrode (10). The TFT and the pixel electrode (10) are electrically connected via a contact hole (34) penetrating the first insulating layers (24, 26) and the second insulating layer (28). A connecting transparent electrode (14) is disposed within the contact hole (34).

10 Claims, 12 Drawing Sheets

Aperture Ratio 76%

(b) PRIOR ART
A-A' Cross-Section (c)

Aperture Ratio 81%

(d) B-B' Cross-Section

TFT SUBSTRATE, METHOD FOR PRODUCING SAME, AND DISPLAY DEVICE

TECHNICAL FIELD

The present invention relates to a TFT substrate, a manufacturing method for the same, and a display device having the TFT substrate.

BACKGROUND ART

As applications for use of liquid crystal display devices increase, an increase in functionality is in progress. In particular, display modes such as MVA (multi-domain vertical alignment) or IPS (in-plane switching) having wide viewing angle characteristics are being developed, and further improvement is in progress.

When performing display of still or moving images, liquid crystal display devices operate such that a voltage applied to a liquid crystal layer is maintained for a prescribed period of time (one frame period, for example) after signal voltages are applied to pixel electrodes. In order to perform such maintenance of voltage more appropriately, in typical liquid crystal display devices, auxiliary capacitance (storage capacitance) is provided in parallel with liquid crystal capacitance. Auxiliary capacitance is formed between an auxiliary capacitance electrode provided in the same layer as gate bus lines, and an auxiliary capacitance opposite electrode is disposed opposite to the auxiliary capacitance electrode across a gate insulating layer, for example.

Also, a technique is known in which auxiliary capacitance is formed by using pixel electrodes and transparent electrodes (hereinafter referred to as lower layer transparent electrode) disposed below the pixel electrodes across an insulating film, and is disclosed in Patent Document 1, for example. According to this technique, auxiliary capacitance is formed by a pair of transparent electrodes, and there is no need to provide separate auxiliary capacitance electrodes made of a metal layer. Thus, it is possible to reduce light-shielding regions, and improve the pixel aperture ratio.

However, when using such a configuration, in order to connect TFTs to pixel electrodes, it is necessary to provide contact holes in the insulating film (hereinafter referred to as upper layer insulating film) interposed between the lower layer transparent electrode and the pixel electrode. As a result, the number of steps for forming contact holes is greater than in conventional configurations.

However, in recent years, the steps for forming contact holes are often performed by dry etching, which can realize a high degree of precision. Typically, dry etching is performed by plasma etching, by which the cross-sectional shape and the like can be controlled with greater ease than with wet etching. However, compared to wet etching, the etching selection ratio (etching rate of film to be removed/etching rate of bottom film (film present below the film to be removed)) is difficult to increase by dry etching, and thus, damage to the bottom film is a concern.

Patent Document 2 discloses a configuration in which a ZnO film is provided on a surface of the drain wiring lines, which are the underlayer, when contact holes are provided over the drain wiring lines and the like in a bottom gate (reverse staggered) TFT. The ZnO film is difficult to etch even with dry etching using an etching gas such as $CF_4$, and therefore, it is possible to appropriately protect the metal film constituting the drain wiring lines. If the drain wiring lines have a structure in which a molybdenum film (or a titanium film or the like) is layered onto an aluminum film, for example, then by providing ZnO film, it is possible to prevent the exposure of the aluminum film as a result of the molybdenum film being removed by etching. If the aluminum film is exposed, then there is a high probability of electrical contact between the aluminum film is exposed, then there is a high probability of electrical contact between the aluminum film and the ITO film to be the pixel electrodes, and thus, this is not preferable.

RELATED ART DOCUMENTS

Patent Documents

Patent Document 1: Japanese Patent Application Laid-Open Publication No. 2008-180807
Patent Document 2: Japanese Patent Application Laid-Open Publication No. 2006-330471

SUMMARY OF THE INVENTION

Problems to be Solved by the Invention

When forming auxiliary capacitance using pixel electrodes as described above, then there is a need for a step to form contact holes in the upper layer insulating film, but in recent years when dry etching has become dominant, it has become necessary to particularly take into consideration damage to the lower layer film. In order to reduce the effect on the lower layer film, contact holes provided in the upper layer insulating film can be provided in a different location from contact holes provided over the drain (drain electrode and drain region of the semiconductor layer) of the TFT, for example. Below, with reference to FIG. 12, a conventional connecting configuration between the TFT and the pixel electrode on a TFT substrate provided with top gate TFTs will be described.

FIG. 12 shows a TFT substrate 900 of a conventional liquid crystal display device in which auxiliary capacitance is formed using a pixel electrode and a transparent electrode. On the TFT substrate 900, top gate (staggered) TFTs (not shown) are provided.

On the TFT substrate 900, a substrate 2 is covered by a base coat layer 4, and on this, a semiconductor layer (an amorphous silicon layer, for example) 6 forming a TFT channel is formed. The semiconductor layer 6 is connected to a drain electrode 99, and the drain electrode 99 is connected to a pixel electrode 10.

On the semiconductor layer 6, an interlayer insulating film 22, a passivation film 24, and an organic insulating film 26 are provided, and on the organic insulating film 26, lower layer transparent electrodes 12 for forming an auxiliary capacitance are formed. Also, the pixel electrode 10 is disposed on the upper layer insulating film 28 covering the lower layer transparent electrode 12, and auxiliary capacitance is formed by the lower layer transparent electrode 12, the upper layer insulating film 28, and the pixel electrode 10. The lower layer transparent electrode 12 is connected to ground, for example, through lines that are not shown.

In such a configuration, a contact hole 30' (contact hole formed in the interlayer insulating film 22) for connecting the semiconductor layer 6 and the drain electrode 99, and a contact hole 32' (contact hole formed in the upper layer insulating film 28) for connecting the drain electrode 99 and the pixel electrode 10 are disposed such that their positions on the substrate are offset. As a result, in the step of forming the contact hole 32', it is more difficult for damage to occur on the semiconductor layer 6 and the like.

However, if the contact holes 30' and 32' are offset in position, then areas that do not contribute to display in the pixel increase, which reduces the pixel aperture ratio. If the contact holes 30' and 32' are provided in the same position, then in order to reduce damage to the drain electrode 99, it is preferable that a separate ZnO film or the like covering the drain electrode be provided in an extra step. As a result, the number of manufacturing steps to provide a stable connection with the pixel electrode 10 increases.

The present invention is made in order to solve the above-mentioned problems, and an object thereof is to provide a TFT substrate and a manufacturing method therefor in which, in a configuration of forming an auxiliary capacitance using pixel electrodes, excellent TFT characteristics are attained while mitigating an increase in the number of steps in the manufacturing process, and the pixel aperture ratio is improved. Also, an object thereof is to provide a display device using such a TFT substrate.

Means for Solving the Problems

A thin film transistor substrate according to an embodiment of the present invention includes: a substrate; a thin film transistor provided on the substrate; a first insulating layer provided over the thin film transistor; a lower layer transparent electrode provided over the first insulating layer; a second insulating layer covering the lower layer transparent electrode; and a pixel electrode provided on the second insulating layer, wherein the lower layer transparent electrode, the second insulating layer, and the pixel electrode form an auxiliary capacitance, wherein the thin film transistor and the pixel electrode are electrically connected to each other in a contact hole penetrating the first insulating layer and the second insulating layer, through a connecting transparent electrode disposed in the contact hole, the connecting transparent electrode being separate from the lower layer transparent electrode.

In an embodiment, the connecting transparent electrode is made of the same material as the lower layer transparent electrode.

In an embodiment, the thin film transistor includes a semiconductor layer constituting a channel, and the semiconductor layer and the contact hole are disposed so as to overlap in a direction normal to the substrate.

In an embodiment, the contact hole includes a first contact hole formed in the first insulating layer and a second contact hole formed in the second insulating layer, and the first contact hole and the second contact hole are disposed so as to correspond to each other in position when viewed from a direction normal to the substrate.

In an embodiment, the connecting transparent electrode is formed on an entire bottom portion of the first contact hole.

In an embodiment, the connecting transparent electrode covers a portion of a side face of the first contact hole.

In an embodiment, the semiconductor layer and the connecting transparent electrode are in direct contact with each other.

In an embodiment, the above-mentioned thin film transistor substrate further includes: a display region where a plurality of the pixel electrodes are arranged, and a peripheral connecting region disposed on an outer side of the display region; a gate wiring line and a source wiring line disposed in the peripheral connecting region, below the first insulating layer and the second insulating layer; a gate contact hole and a source contact hole formed respectively over the gate wiring line and the source wiring line so as to penetrate the first insulating layer and the second insulating layer; and a peripheral transparent electrode formed separately from the lower layer transparent electrode in at least the gate contact hole or the source contact hole.

In an embodiment, a conductive layer made of the same material as the pixel electrodes is further included, the conductive layer connecting the gate wiring line and the source wiring line through the gate contact hole and the source contact hole.

A display device according to an embodiment of the present invention includes: any one of the above-mentioned thin film transistor substrates; and a display medium layer disposed on the thin film transistor substrate.

A method of manufacturing a thin film transistor substrate according to an embodiment of the present invention includes: preparing a substrate; forming a thin film transistor on the substrate; forming a first insulating layer over the thin film transistor; forming a first contact hole in the first insulating layer; forming a lower layer transparent electrode over the first insulating layer and forming a connecting transparent electrode made of the same material as the lower layer transparent electrode in the first contact hole so as to be separate from the lower layer transparent electrode; forming a second insulating layer covering the lower layer transparent electrode and the connecting transparent electrode; forming a second contact hole in the second insulating layer; and forming a pixel electrode on the second insulating layer, wherein a drain of the thin film transistor is connected to the pixel electrode through the connecting transparent electrode.

In an embodiment, the step of forming the connecting transparent electrode includes: forming a transparent conductive layer covering an inside region of the first contact hole and a region outside of the first contact hole integrally; disposing photoresist inside the first contact hole; forming a resist mask that selectively covers only a vicinity of a bottom of the first contact hole by partially removing the photoresist inside the first contact hole; and forming the connecting transparent electrode by partially removing the transparent conductive layer using the resist mask.

In an embodiment, the photoresist is a positive photoresist, the step of disposing the photoresist inside the first contact hole includes a step of disposing a photoresist layer that integrally covers the region inside the first contact hole and the region outside of the first contact hole, the step of forming the resist mask includes: disposing a mask having an opening that overlaps the first contact hole at least partially over the photoresist layer; and exposure and developing in which the photoresist inside the first contact hole in the photoresist layer is partially exposed through the opening in the mask, and in which the exposed photoresist is removed by developing, and wherein in the step of exposure and developing, exposure is performed at a selected exposure amount such that only photoresist in a vicinity of a bottom of the first contact hole, among the photoresist inside the first contact hole, remains after developing.

Effects of the Invention

According to embodiments of the present invention, in a configuration in which auxiliary capacitance is formed using transparent electrodes disposed below pixel electrodes through an insulating film, it is possible to improve the pixel aperture ratio. Also, it is possible to reduce damage to the underlayer film in the step of forming a contact hole in order to connect the pixel electrode and the drain of the TFT, and thus, it is possible to improve the reliability of the connection.

BRIEF DESCRIPTION OF THE DRAWINGS

FIG. 7(a) is a cross-sectional view of a step of photoresist exposure, FIG. 7(b) is a cross-sectional view of a state after developing, and FIG. 7(c) is a cross-sectional view of a state after etching.

DETAILED DESCRIPTION OF EMBODIMENTS

TFT substrates used in liquid crystal display devices will be described below as embodiments of the present invention with reference to drawings, but the present invention is not limited thereto.

(Embodiment 1)

Figure 1:
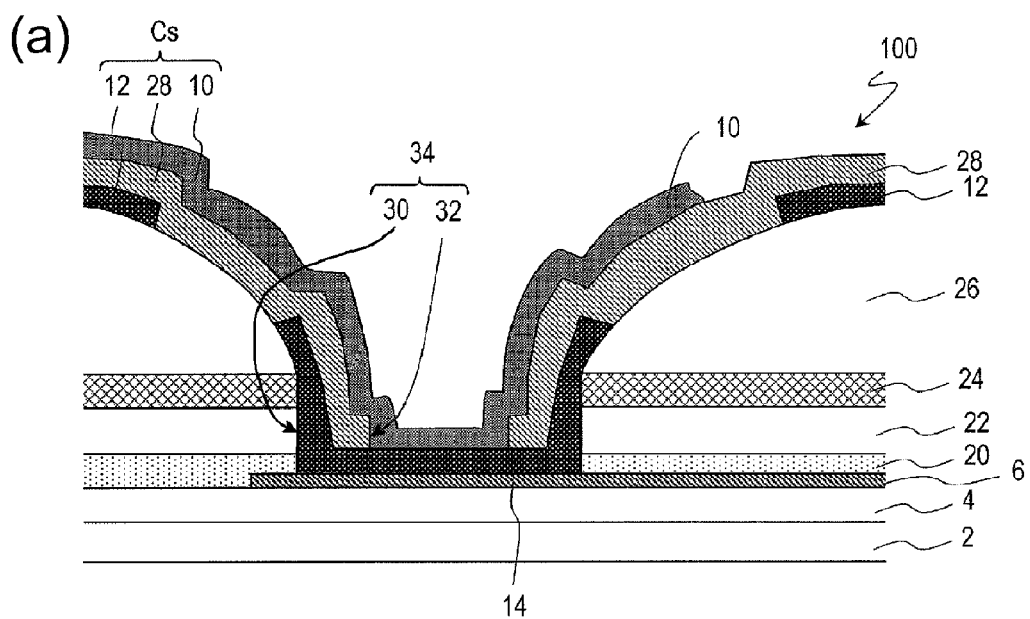
FIG. 1(a) is a cross-sectional view showing a drain contact portion of a TFT substrate of Embodiment 1.
FIG. 1(b) is a cross-sectional view showing a gate-source contact portion.
Figure 1:
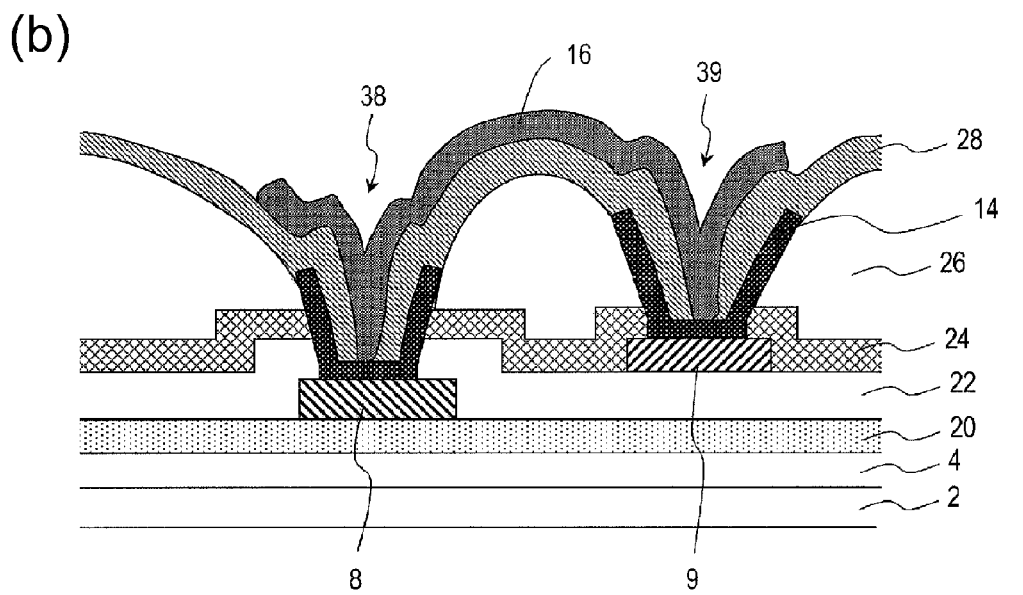

FIGS. 1(a) and 1(b) are cross-sectional views showing a TFT substrate 100 according to Embodiment 1 of the present invention, provided here with top gate (staggered) TFTs. FIG. 1(a) shows a connecting portion between the TFT and a pixel electrode in the vicinity of the TFT, and FIG. 1(b) shows a connecting portion between a gate wiring line and a source wiring line in a peripheral connecting region located outside of a region where pixels are disposed (display region).

As shown in FIG. 1(a), on the TFT substrate 100, a semiconductor layer 6 for forming a TFT channel is provided on a substrate 2 covered by a base coat layer 4.

On the semiconductor layer 6, a gate insulating film 20 is provided, and on the gate insulating film 20, gate bus lines and gate electrodes (neither of which are shown) are provided. As shown in FIG. 1(b), gate wiring lines 8 disposed in the peripheral connecting region are provided. In the present specification, these are collectively referred to as the gate layers. In the TFT substrate 100, an auxiliary capacitance line is not provided in this layer (gate layer).

On the gate insulating film 20, an interlayer insulating film 22 is provided, and through the interlayer insulating film 22, source electrodes and source bus lines (neither of which are shown), and source wiring lines 9 are provided in the peripheral connecting region. In the present specification, these are collectively referred to as the source layers.

Although not shown, the source electrode (or source bus line) and the semiconductor layer 6 are typically connected electrically to each other in a contact hole (not shown) formed in the interlayer insulating film 22. Such a configuration is disclosed in Patent Document 1, for example. However, in the TFT substrate 100 of the present embodiment, drain electrodes are not provided in the source layer.

In the semiconductor layer 6, a TFT channel is formed in the portion thereof facing a gate electrode through the gate insulating film 20. A source and drain (n+ impurity region formed by impurity implantation, for example) of the TFT may be formed in the semiconductor layer 6 such that the channel is in between.

On the TFT substrate 100, a passivation film 24 as a protective film for the TFTs is formed so as to cover the source layer formed on the interlayer insulating film 22. Also, an organic insulating film 26 is formed on the passivation film 24. The organic insulating film 26 is provided as a planarizing film providing a flat surface upon which the pixel electrode 10 is to be formed.

The TFT substrate 100 is provided with a lower layer transparent electrode 12 disposed on the organic insulating film 26, an upper layer insulating film 28 that covers this, and a transparent pixel electrode 10 formed on the upper layer insulating film 28 so as to have a portion overlapping the lower layer transparent electrode 12. An auxiliary capacitance (storage capacitance) Cs is formed by the pair of transparent electrodes (pixel electrode 10 and lower layer transparent electrode 12) that face each other through the upper layer insulating film 28.

The lower layer transparent electrode 12 is connected to ground, for example, using wiring lines that are not shown. When using the TFT substrate 100 in a liquid crystal display device, the lower layer transparent electrode 12 may be connected to a wiring line so as to be at the same potential as an opposite electrode on an opposite substrate disposed facing the TFT substrate 100.

The connection of the drain of the TFT to the pixel electrode 10 is made through a lower layer contact hole (first contact hole) 30 provided through the gate insulating film 20, the interlayer insulating film 22, and the passivation film 24, and through an upper layer contact hole (second contact hole) 32 provided through the upper layer insulating film 28. As can be seen in the drawing, the upper layer contact hole 32 is formed within the lower layer contact hole 30. These are formed so as to overlap when viewed from the direction normal to the substrate, and by the lower layer contact hole 30 and the upper layer contact hole 32, a common contact hole 34 is formed so as to penetrate the respective insulating films between the pixel electrode and the TFT drain (passivation film 24, upper layer insulating film 28, and the like).

Within the lower layer contact hole 30, a connecting transparent electrode 14 made of the same material and in the same step as the lower layer transparent electrode 12 as will be described later is provided. The connecting transparent electrode 14 is formed so as to be separate from the lower layer transparent electrode 12 and does not form an auxiliary capacitance. The connecting transparent electrode 14 is in contact with a contact portion (TFT drain) of the semiconductor layer 6, and is provided so as to be in contact with the pixel electrode 10, and is used in order to connect the semiconductor layer 6 and the pixel electrode 10.

In such a configuration, the TFT drain and the pixel electrode 10 are connected through a contact hole 34 that is in one location. In this manner, the area taken up by the contact hole can be reduced, thus improving the aperture ratio of the respective pixels. Also, the connecting transparent electrode 14 is formed on the bottom of the contact hole 34, and as will be described later, damage to the semiconductor layer 6 is prevented in a step of providing the upper layer contact hole 32 in the upper insulating film 28. Also, a metal layer (drain electrode) having light-shielding properties is not provided in the contact hole 34, and thus, pixel transparency is high, and a TFT substrate 100 suitable for performing display with a high brightness can be obtained.

Next, with reference to FIG. 1(b), the connective configuration of the gate line and the source line in the peripheral connecting region will be described.

In the peripheral connecting region, the gate wiring line 8 and the source wiring line 9 are connected by a gate contact hole 38 and a source contact hole 39 provided respectively thereabove. Gate and source contact holes 38 and 39 are obtained by overlapping contact holes in a configuration similar to that shown in FIG. 1(a). The upper layer transparent electrode 16 formed in the same step as the pixel electrode 10 is provided so as to be connected to the gate wiring line 8 and the source wiring line 9 respectively exposed in the gate and source contact holes 38 and 39, and as a result, the gate wiring line 8 and the source wiring line 9 are connected to each other.

Within the gate and source contact holes 38 and 39 also, connecting transparent electrodes (peripheral transparent electrodes) 14 are disposed, similar to the display region (pixel array region). As a result, the gate wiring line 8 and the source wiring line 9 can be appropriately connected while preventing damage to the surfaces of the gate wiring line 8 and the source wiring line 9.

The connection between the gate wiring line 8 and the source wiring line 9 in the peripheral connecting region is performed in the following case. If the gate wiring line is used as a wiring line from the source driver disposed in the frame region to the end of the source bus line, for example, then in order to input a source signal from the driver to the source bus line, the gate wiring line and the source wiring line (source bus line) need to be connected. Also, when using an oxide semiconductor such as IGZO (an oxide made of indium, gallium, and zinc) as the semiconductor layer 6, then there is the possibility of integrally forming driver circuits on the substrate using gate wiring lines and source wiring lines along with the oxide semiconductor, but even in this case, in order to form a prescribed circuit, there is a need to connect the gate wiring lines and the source wiring lines.

Figure 2:
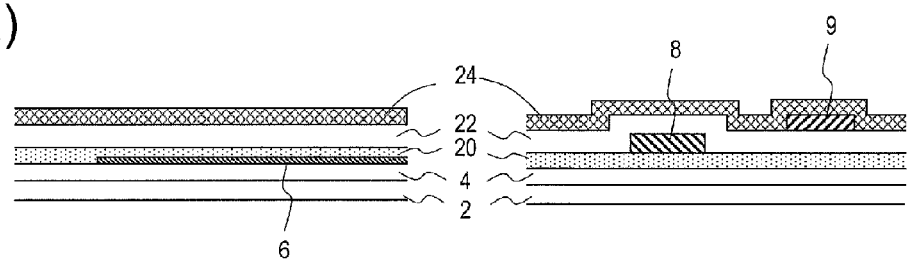
FIG. 2 includes cross-sectional views for describing a manufacturing method for the TFT substrate of Embodiment 1, and FIGS. 2(a) and 2(b) respectively show different steps.
Figure 2:
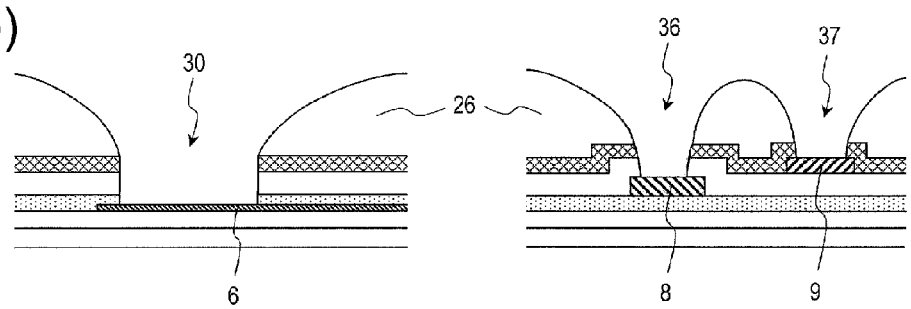
Figure 3:
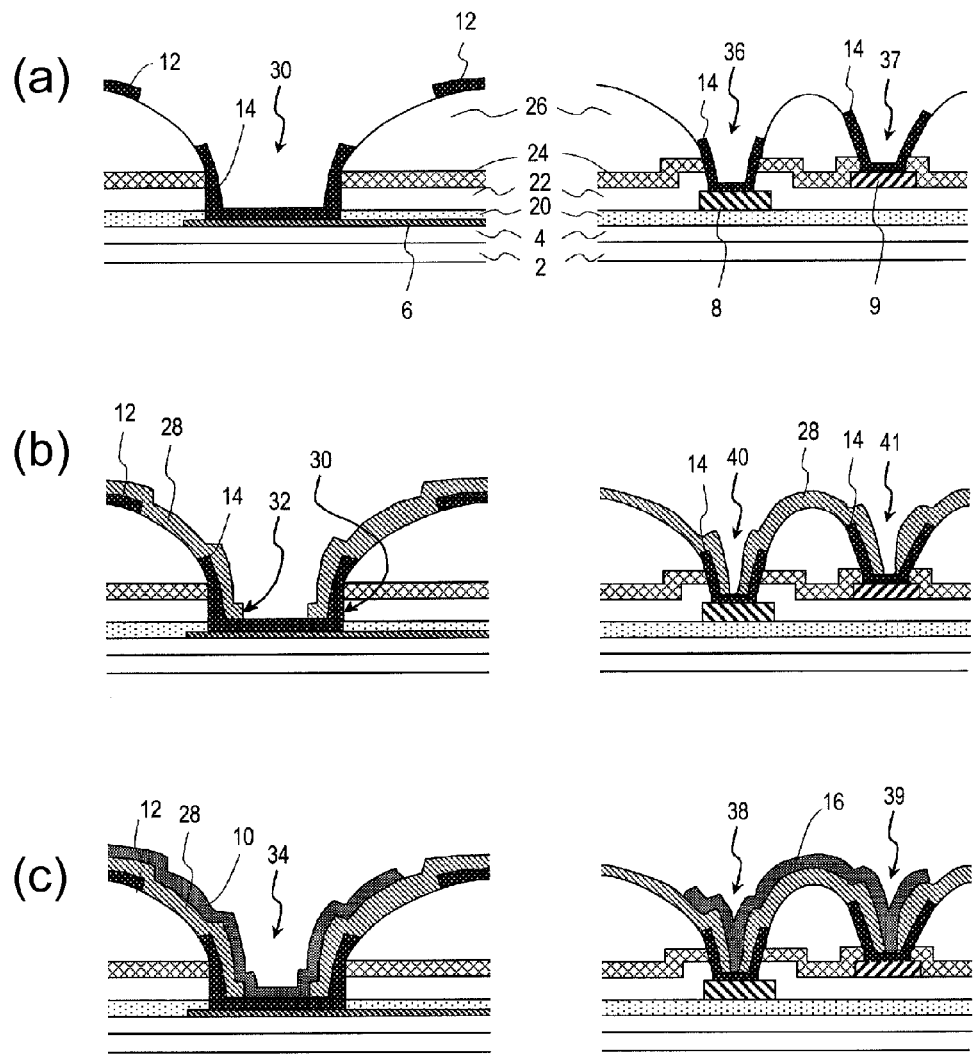
FIG. 3 includes cross-sectional views for describing a manufacturing method for the TFT substrate of Embodiment 1, and FIGS. 3(a) to 3(c) respectively show different steps.

Steps to manufacture the TFT substrate 100 will be explained below with reference to FIGS. 2 and 3. In FIGS. 2 and 3, the left side of the drawings shows the connecting portion of the TFT drain and the pixel electrode 10, and the right side of the drawings shows the connecting portion of the gate wiring line 8 and the source wiring line 9 in the peripheral connecting region.

As shown in FIG. 2(a), first, the base coat layer 4 is formed on the transparent substrate 2 made of glass or the like, and the semiconductor layer 6 is formed thereon. The base coat layer 4 is an SiN film with a thickness of 100 nm or an SiO$_2$ film with a thickness of 100 nm, for example. Also, the semiconductor layer 6 is made of a-Si (amorphous silicon) or p-Si (polysilicon), for example. The semiconductor layer 6 may be an oxide semiconductor such as IGZO. If the semiconductor layer 6 is p-Si or IGZO, the thickness thereof may be approximately 50 nm, and if the semiconductor layer 6 is a-Si, the thickness thereof may be approximately 50 to 200 nm, for example. If the semiconductor layer 6 is a-Si or p-Si, it can be patterned by dry etching, and if the semiconductor layer 6 is IGZO, it can be patterned by wet etching using oxalic acid. The semiconductor layer 6 is typically formed in island shapes in a prescribed region.

On the semiconductor layer 6, the gate insulating film 20 is formed, and on the gate insulating film 20, a gate layer (gate bus lines, gate electrodes, gate wiring lines 8, and the like) is formed. The gate insulating film 20 is made of SiO$_2$ with a thickness of 100 nm, for example, and the gate layer is formed so as to have a layered structure of Ti (50 nm)/Al (100 nm)/Ti (30 nm), for example.

Next, the interlayer insulating film 22 (SiO$_2$ film with a thickness of 300 nm or SiN$_x$ film with a thickness of 150 nm, for example) is formed so as to cover these, and a source layer (source bus lines, source electrodes, source wiring lines 9, and the like) is formed thereon. The source layer is formed having a layered structure of Ti (50 nm)/Al (100 m)/Ti (30 nm), for example, and can be patterned by dry etching using a chlorine-based gas. As necessary, a configuration may be used in which contact holes are provided in the interlayer insulating film 22 prior to forming the source layer, thereby forming contact between the source region of the semiconductor layer 6 and the source bus line and source electrode.

The passivation film 24 is formed so as to cover the source layer as a protective film. The passivation film 24 is made of an SiO$_2$ film with a thickness of 200 nm, for example.

Then, as shown in FIG. 2(b), an organic insulating film 26 is formed so as to cover the passivation film 24. The organic insulating film 26 can be formed to a thickness of 2.5 μm by performing patterning using a prescribed mask by photolithography, for example.

Next, in the drain connecting portion (left side of figure), portions of the passivation film 24, the interlayer insulating film 22, and the gate insulating film 20 are removed by dry etching, and a lower layer contact hole 30 is formed. Also, in the peripheral connecting region (right side of figure), the insulating film on the gate wiring line 8 and the insulating film on the source wiring line 9 are etched, thus forming the lower layer gate contact hole 36 and the lower layer source contact hole 37.

In this step, the organic insulating film 26 is used as a mask to dry etch the passivation film 24, the interlayer insulating film 22, and the gate insulating film 20. CF$_4$+O$_2$ can be used as the etching gas in this case. However, if the semiconductor layer 6 is made of a-Si, the etching selection ratio may be maintained by switching the etching gas to CHF$_3$ or C$_4$F$_8$ gas as a depth close to the semiconductor layer 6 is reached. If the semiconductor layer 6 is an oxide semiconductor, then the selection ratio is maintained even with the continued usage of CF$_4$+O$_2$ gas.

In the peripheral connecting region, the gate/source wiring lines 8 and 9 receive damage in the thickness direction in the step of dry etching. However, if a layered structure in which an aluminum film surface is covered by a titanium film or a molybdenum film is used for the gate/source wiring lines 8 and 9, then as a result of the top layer titanium film or molybdenum film, the surface of the aluminum film can be prevented from being exposed during etching.

Then, as shown in FIG. 3(a), a transparent conductive film made of ITO, IZO, or the like is formed, for example, and by patterning it by photolithography, the lower layer transparent electrode 12 is formed. At this time, the connecting transparent electrode 14 is formed in the lower layer contact hole 30 formed in the previous step. Also, in the peripheral connecting region, connecting transparent electrodes 14 are respectively formed on the gate wiring line 8 and the source wiring line 9 in the respective lower layer gate/source contact holes 36 and 37. The lower layer transparent electrodes 12 and the connecting transparent electrode 14 are made of an a-ITO film (amorphous ITO film) or an IZO film that is 50 nm in thickness, for example.

The method of forming the lower layer transparent electrodes 12 and the connecting transparent electrode 14 will be described later, but the connecting transparent electrode 14 can be formed in the lower layer contact hole 30 in a self-aligned manner. Of course, the connecting transparent electrode 14 can be formed in a deliberate manner in the lower layer contact hole 30 by patterning using photoresist.

Then, as shown in FIG. 3(b), the upper layer insulating film 28 is formed so as to cover the lower layer transparent electrodes 12 and the connecting transparent electrode 14. The upper layer insulating film 28 is made of an $SiO_2$ film or an $SiN_x$ film that is 200 nm in thickness, for example. Then, the upper layer insulating film 28 in the lower layer contact hole 30 is removed by etching, thus forming the upper layer contact hole 32. In the peripheral connecting region, the upper layer insulating film 28 is removed in the lower layer gate/source contact holes 36 and 37, thus forming upper layer gate/source contact holes 40 and 41.

In this step, using photolithography, an opening is formed in the resist in the lower layer contact hole 30, and the upper layer insulating film 28 is dry-etched. At this time, the already formed connecting transparent electrode 14 serves as an etching stopper, and thus, even if dry etching with $CF_4+O_2$ is performed, damage to the semiconductor layer 6 (a-Si, p-Si, oxide semiconductor) therebelow is prevented while forming the upper layer contact hole 32 in the lower layer contact hole 30 to expose a portion of the connecting transparent electrode 14. The connecting transparent electrode 14 also functions as an etching stopper in the peripheral connecting region, and thus, the upper layer gate/source contact holes 40 and 41 to expose the connecting transparent electrode 14 are respectively formed without damaging the gate wiring line 8 or the source wiring line 9.

Then, as shown in FIG. 3(c), the upper layer transparent conductive film (specifically, a transparent conductive film (ITO, IZO, or the like)) is formed, and by patterning this by photolithography, the pixel electrodes 10 and the like are formed. The upper layer transparent film is made of an a-ITO film or an IZO film that is 50 nm in thickness, for example.

The pixel electrode 10 (upper layer transparent conductive film) connected to the TFT drain is used in order to apply a voltage to a display medium layer such as a liquid crystal layer, and forms an auxiliary capacitance with the lower layer transparent electrode 12 disposed so as to face the pixel electrode 10 through the upper layer insulating film 28. Also, in the peripheral connecting region, the upper layer transparent electrodes 16 (upper layer transparent conductive film) connected to the gate/source wiring lines 8 and 9 have the function of electrically connecting the gate/source wiring lines together, and can be used as a third layer wiring line after the gate layer and the source layer.

As explained above, in the TFT substrate 100 of the present embodiment, in a configuration in which an auxiliary capacitance is formed using the pixel electrodes 10 and the lower layer transparent electrodes 12, the lower layer contact holes 30 and the upper layer contact holes 32 respectively overlap, allowing an improvement in pixel aperture ratio. Also, in the lower layer contact hole 30, the connecting transparent electrodes 14 functioning as the etching stopper are formed in the same step and of the same material as the lower layer transparent electrodes 12, and thus, damage to the semiconductor layer 6 when forming the upper layer contact holes 32 can be mitigated without increasing the number of steps.

Also, in the TFT substrate 100, in the drain connecting portion in the contact hole 34, a metal drain electrode (light-shielding portion), which was provided in conventional configurations, is not provided, and thus, light transmittance in the pixels can be improved.

Furthermore, the source layer and the upper layer transparent film are not directly connected, and the connecting transparent electrode 14 is interposed therebetween, and thus, in the peripheral connecting region, even if the upper layer transparent electrode 16 is made of ITO, and the aluminum film is exposed on the surface of the source layer, by making the connecting transparent electrode 14 of IZO or the like, electrical contact between ITO and Al can be prevented.

(Embodiment 2)

Figure 4:
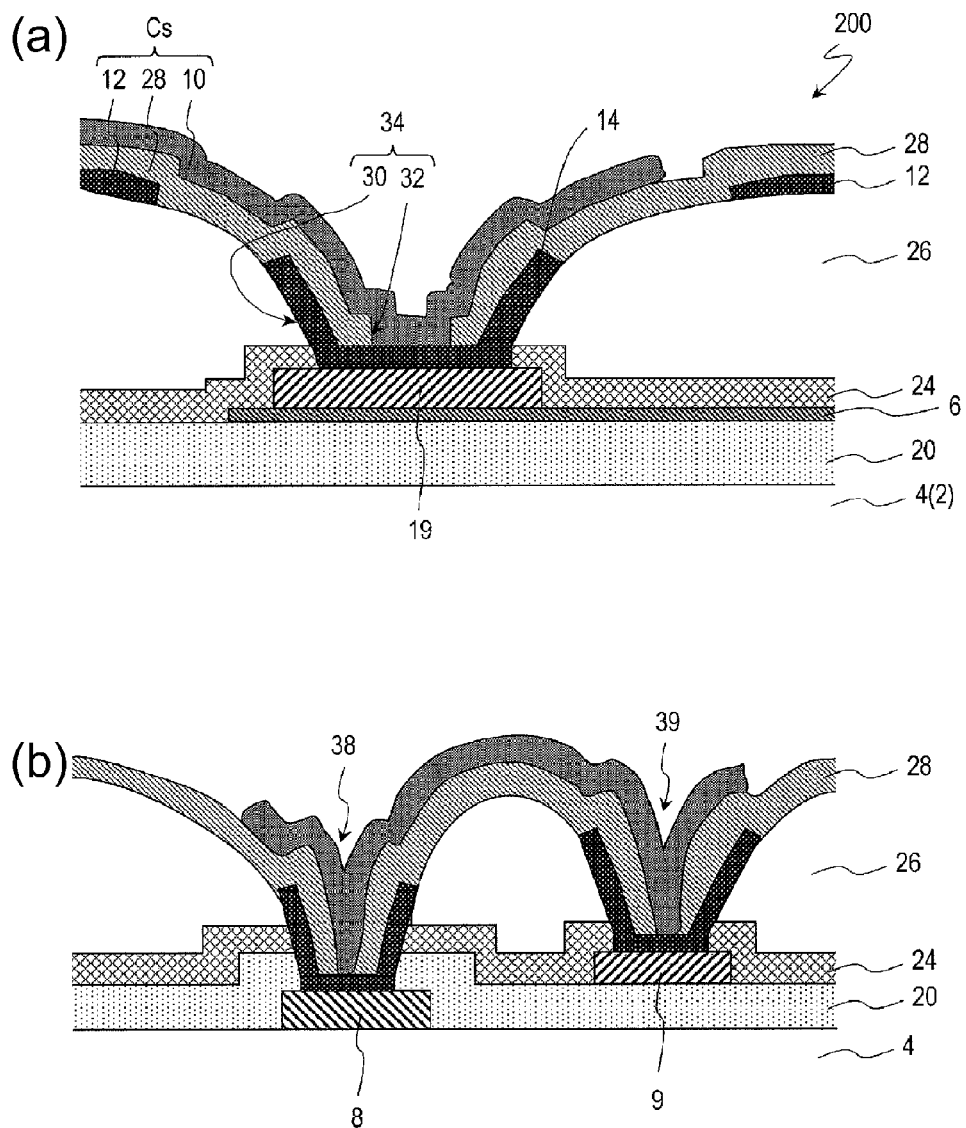
FIG. 4(a) is a cross-sectional view showing a drain contact portion of a TFT substrate of Embodiment 2.
FIG. 4(b) is a cross-sectional view showing a gate-source contact portion.

FIGS. 4(a) and 4(b) are cross-sectional views showing a TFT substrate 200 according to Embodiment 2 of the present invention. Here, bottom gate (reverse staggered) TFTs are provided. In FIG. 4(a), a connecting portion between a TFT and a pixel electrode 10 in the vicinity of the TFT is shown, and in FIG. 4(b), the connecting configuration between a source wiring line and a gate wiring line in a peripheral connecting region located outside the region where pixels are arranged is shown. Components having functions similar to those of Embodiment 1 are assigned similar reference characters and descriptions thereof are omitted.

As shown in FIGS. 4(a) and 4(b), in the TFT substrate 200, on a substrate 2 covered by a base coat layer 4, a gate layer including gate bus lines (not shown) and gate wiring lines 8 is provided, and a gate insulating film 20 is provided so as to cover this.

On the gate insulating film 20, a semiconductor layer 6 for forming a TFT channel is provided. On the semiconductor layer 6, a source layer including source bus lines (not shown), source wiring lines 9, and the like is provided. Also, in the drain connecting portion (FIG. 4(a)), a drain electrode 19 is provided on the semiconductor layer 6. The drain electrode 19 may have a layered configuration of Ti (50 nm)/Al (100 nm)/Ti (30 nm), for example.

Also, on the source layer, a passivation film 24 as a protective film, and an organic insulating film 26 as a planarizing film are formed. On the TFT substrate 200 also, lower layer transparent electrodes 12 disposed on the organic insulating film 26, an upper layer insulating film 28 covering this, and transparent pixel electrodes 10 are provided, and as a result, an auxiliary capacitance (storage capacitance) Cs is formed.

Also, on the bottom of the lower layer contact hole 30 formed in the passivation film 24 and the organic insulating film 26, a connecting transparent electrode 14 made of the same material as the lower layer transparent electrode 12 is disposed. The connecting transparent electrode 14 is provided on the drain electrode 19 so as to be in contact therewith.

In the present embodiment also, the upper layer contact hole 32 provided in the upper layer insulating film 28 is disposed inside the lower layer contact hole 30, and as a result, a contact hole 34 that penetrates the insulating film between the pixel electrode and the TFT drain is formed. In the contact hole 34, the pixel electrode 10 is connected to the drain electrode 19 through the connecting transparent electrode 14. As shown in FIG. 4(b), the configuration of the peripheral connecting region is similar to that of FIG. 1(b)

except that the gate wiring lines 8 are located below the gate insulating film 20 and that the gate contact hole 38 penetrates the gate insulating film 20.

The method of manufacturing the TFT substrate 200 will be explained below with reference to FIGS. 5 and 6.

Figure 5:
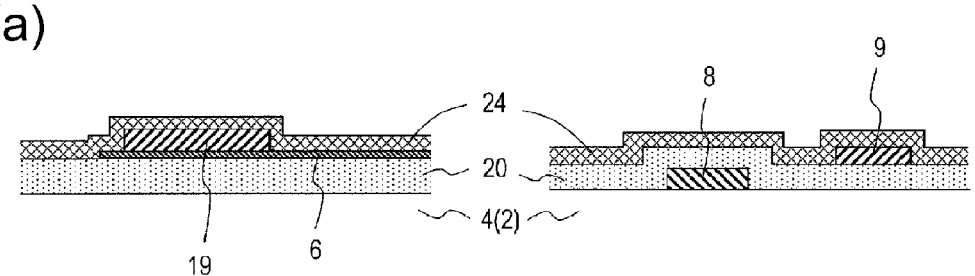
FIG. 5 includes cross-sectional views for describing a manufacturing method for the TFT substrate of Embodiment 2, and FIGS. 5(a) and 5(b) respectively show different steps.
Figure 5:
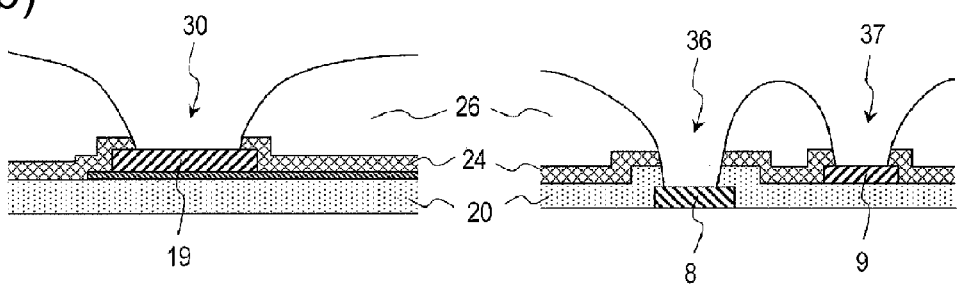

As shown in FIG. 5(*a*), first, a gate layer (gate bus lines, gate electrodes, gate wiring lines 8, and the like) is formed on the substrate 2 having a surface on which the base coat layer 4 is formed. The gate layer is formed so as to have a layered structure of Ti (50 nm)/Al (100 nm)/Ti (30 nm), for example. Also, the gate insulating film 20 is formed so as to cover the gate layer. The gate insulating film 20 is made of an $SiO_2$ film that is 50 nm in thickness or an $SiN_x$ film that is 300 nm in thickness, for example.

The semiconductor layer 6 is formed on the gate insulating film 20. The semiconductor layer 6, similar to Embodiment 1, may be made of a-Si (amorphous silicon) or an oxide semiconductor such as IGZO, and is typically formed in island shapes in a prescribed region.

Next, the source layer is formed, but in the present embodiment, in this step, the drain electrodes 19 are formed along with the source bus lines, the source electrodes, the source wiring lines 9, and the like. These are formed so as to have a layered structure of Ti (50 nm)/Al (100 nm)/Ti (30 nm), for example, and can be obtained by patterning by dry etching using a chlorine-based gas. Furthermore, the passivation film 24 is formed as a protective film to cover the source layer.

Then, as shown in FIG. 5(*b*), an organic insulating film 26 is formed so as to cover the passivation film 24. The organic insulating film 26 is patterned using a prescribed mask by photolithography, for example, and can be formed to a thickness of 2.5 μm.

Next, in the drain connecting portion (left side of the drawing), using the organic insulating film 26 as a mask, portions of the passivation film 24 are removed by dry etching, and the lower layer contact holes 30 are formed. In the peripheral connecting region (right side of the drawing), the insulating film on the gate wiring line 8 and the insulating film on the source wiring line 9 are etched, thus forming the lower layer gate contact hole 36 and the lower layer source contact hole 37.

The etching gas for forming the lower layer contact hole 30 and the lower layer gate/source contact holes 36 and 37 can be $CF_4+O_2$. Although the drain electrode 19 and the gate/source wiring lines 8 and 9 receive damage in the thickness direction, as described above, if these have a layered structure in which titanium films or molybdenum films sandwich the aluminum film, then, as a result of the surface layer titanium film or molybdenum film, exposure of the surface of the aluminum film during etching can be mitigated.

Also, in the TFT substrate 200, in the etching step, even if the aluminum film is exposed on the surface of the drain electrode 19, as will be described later, the connecting transparent electrode 14 is formed thereon. In this case, if the connecting transparent electrode 14 is made of IZO, then even if the pixel electrode 10 is made of ITO, electrical contact between the pixel electrode 10 and the drain electrode 19 is prevented, and an appropriate electrical connection can be made between the pixel electrode 10 (ITO) and the drain electrode 19 (Al) through the connecting transparent electrode 14 made of IZO.

Figure 6:
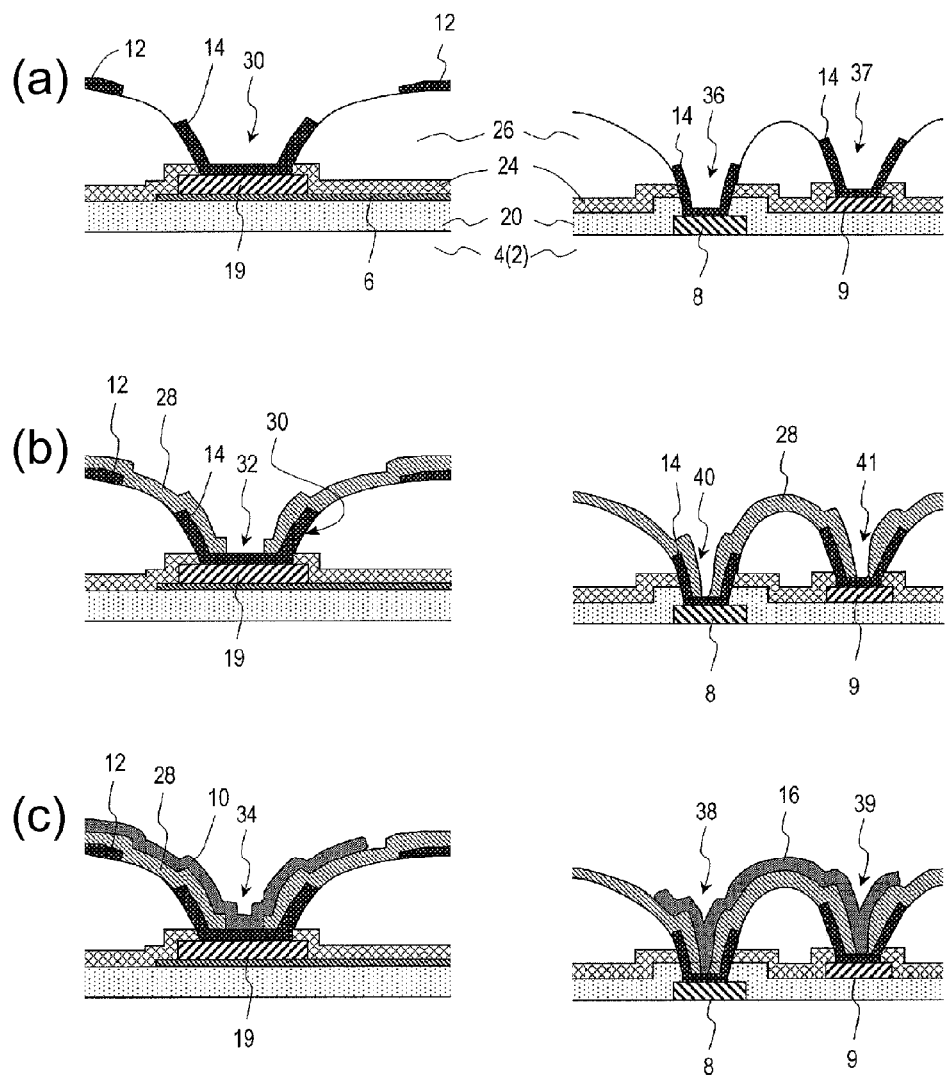
FIG. 6 includes cross-sectional views for describing a manufacturing method for the TFT substrate of Embodiment 2, and FIGS. 6(a) to 6(c) respectively show different steps.

Then, as shown in FIG. 6(*a*), a transparent electrode film made of ITO, IZO, or the like is formed and then patterned by photolithography, thereby forming the lower layer transparent electrodes 12. At this time, the connecting transparent electrode 14 is formed in the lower layer contact hole 30 formed in the previous step. Also, in the peripheral connecting region, connecting transparent electrodes 14 are respectively formed on the gate wiring line 8 and the source wiring line 9 in the respective lower layer gate/source contact holes 36 and 37. The lower layer transparent electrodes 12 and the connecting transparent electrode 14 are made of an a-ITO film or an IZO film with a thickness of 50 nm, for example.

Then, as shown in FIG. 6(*b*), the upper layer insulating film 28 is formed so as to cover the lower layer transparent electrodes 12 and the connecting transparent electrode 14. The upper layer insulating film 28 is made of an $SiO_2$ film or an $SiN_x$ film that is 200 nm in thickness, for example. Then, the upper layer insulating film 28 in the lower layer contact hole 30 is removed by etching, thus forming the upper layer contact hole 32. In the peripheral connecting region, the upper layer insulating film 28 in the lower layer gate/source contact holes 36 and 37 is removed, thus forming the upper layer gate/source contact holes 40 and 41.

In this step, using photolithography, a resist opening is formed in the already formed lower layer contact hole 30, and dry etching is performed. At this time, the already formed connecting transparent electrode 14 functions as an etching stopper, and thus, even if dry etching is performed with $CF_4+O_2$, damage to the drain electrodes 19 and the like is prevented. In the peripheral connecting region also, the connecting transparent electrodes 14 function as an etching stopper, and thus, the upper layer gate contact hole 40 and the upper layer source contact hole 41 exposing the connecting transparent electrodes 14 are formed without damaging the gate wiring line 8 or the source wiring line 9.

Then, as shown in FIG. 6(*c*), the upper layer transparent conductive film (specifically, the transparent conductive film (ITO, IZO, or the like)) is formed, and the pixel electrodes 10 are formed by patterning by photolithography. The upper layer transparent conductive film is made of an a-ITO film or an IZO film that is 50 nm in thickness, for example.

The pixel electrode 10 connected to the TFT drain forms an auxiliary capacitance with the lower layer transparent electrode 12 disposed facing the pixel electrode 10 through the upper layer insulating film 28. In the peripheral connecting region, the upper layer transparent electrode 16 formed so as to be connected to the gate/source wiring lines 8 and 9 can be used as a third layer wiring line connecting the gate/source wiring lines electrically to each other.

In the present embodiment, in the contact hole 34, even if the aluminum on the surface of the drain electrode 19 is exposed, by making the connecting transparent electrode 14 of IZO, contact can be suitably established with the pixel electrode 10 made of ITO.

Next, a modification example of the TFT substrate 200 of Embodiment 2 having the reverse staggered TFT structure will be described.

Figure 11:
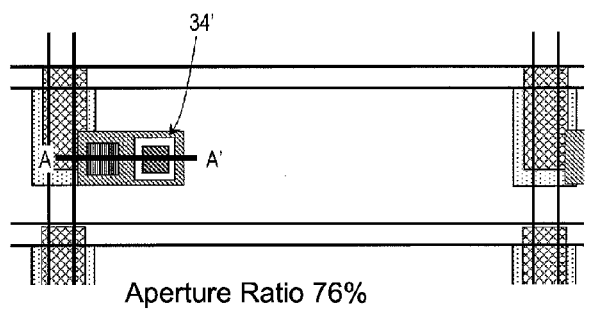
FIGS. 11(a) and 11(b) show contact holes in a conventional reverse-staggered TFT configuration.
FIGS. 11(c) and 11(d) show a contact hole in the reverse-staggered TFT configuration of an embodiment of the present invention.
Figure 11:
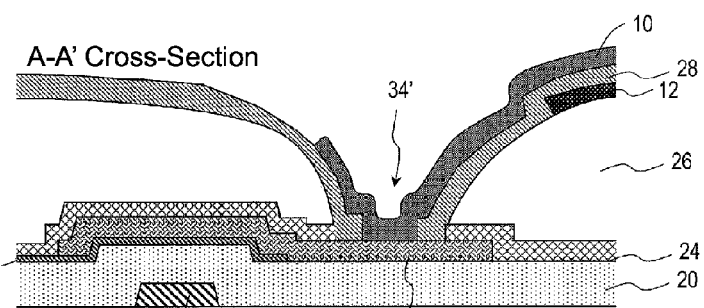
Figure 11:
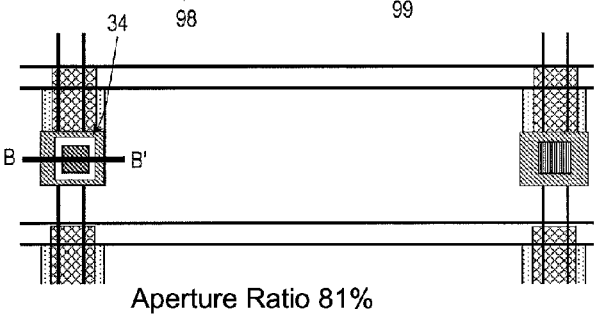
Figure 11:
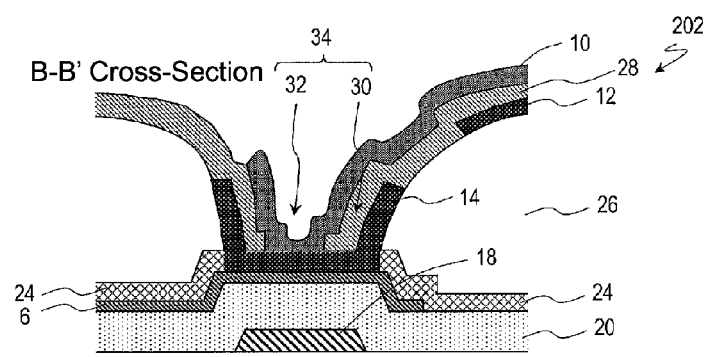
Figure 12:
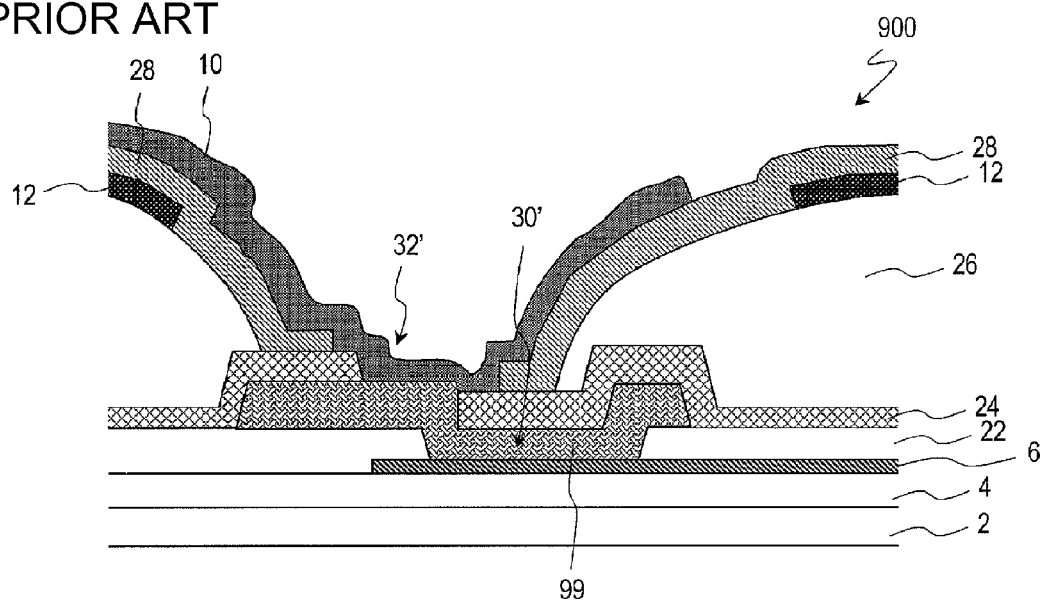
FIG. 12 is a cross-sectional view showing a drain contact portion of a conventional TFT substrate.

FIG. 11(*d*) shows a TFT substrate 202 of a modification example of Embodiment 2. In the TFT substrate 202, in the drain connecting portion of the reverse staggered TFT, unlike the TFT substrate 200, a drain electrode is not provided in the contact hole 34. In the TFT substrate 202, in the contact hole 34, the semiconductor layer 6 is directly connected to the connecting transparent electrode 14. By doing so, even if using a reverse staggered TFT structure, it is possible to realize a pixel configuration with high light transmittance with as small an amount as possible of metal layer as a light-shielding layer.

(Step of Forming Lower Layer Electrode)

Figure 7:
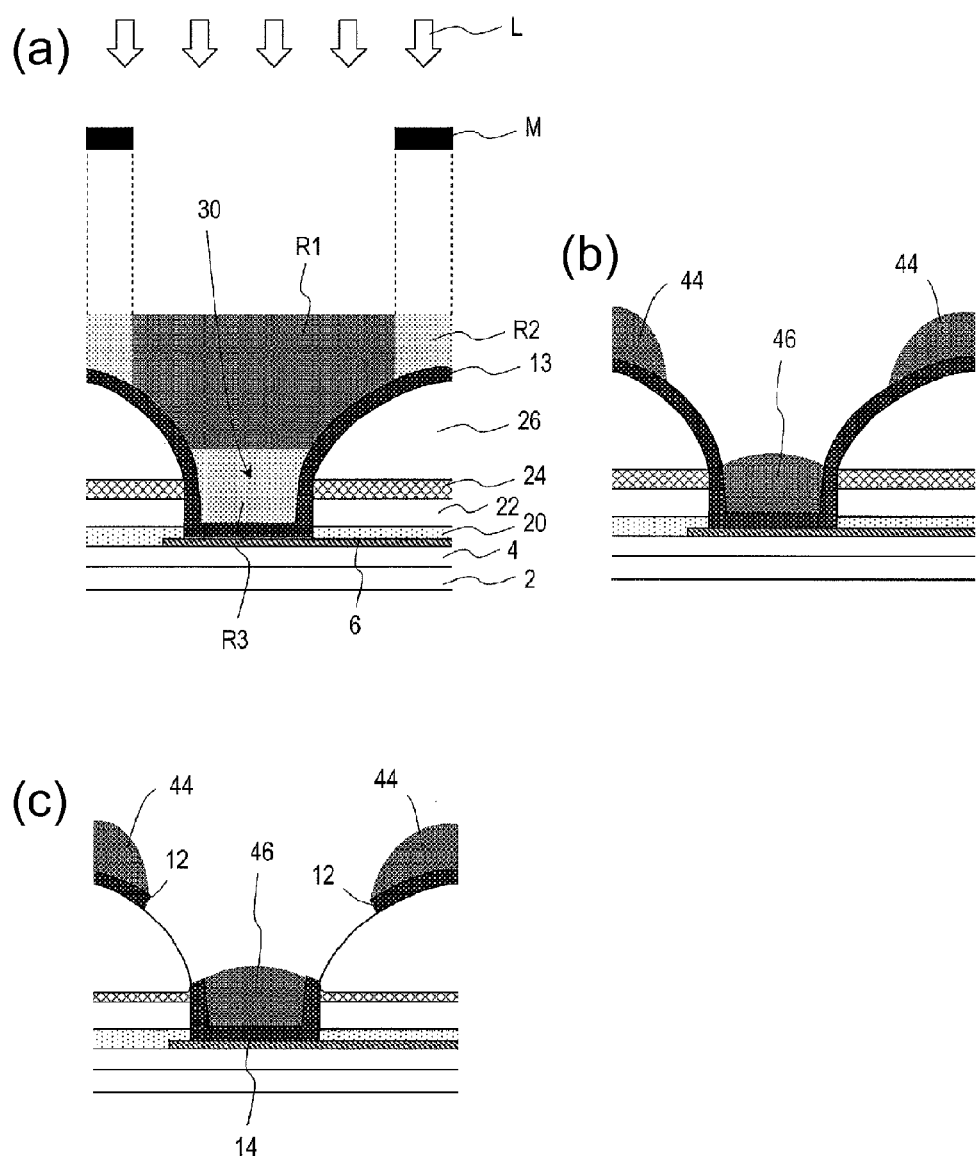
FIG. 7 shows a step of providing a transparent electrode in a contact hole.

Below, with reference to FIGS. 7 to 9, a step of forming the connecting transparent electrode 14 in the lower layer contact hole 30 in a self-aligned manner in the step of forming the lower layer transparent electrode 12 (refer to FIGS. 3(a) and 6(a)) will be described.

FIG. 7(a) shows a step of forming a resist mask used for patterning the lower layer transparent electrodes 12 and the connecting transparent electrode 14, and specifically shows an exposure process for photoresist to be a resist mask. The lower layer transparent electrodes 12 and the connecting transparent electrode 14 are formed by patterning using a resist mask after forming the transparent conductive film 13 made of ITO, IZO, or the like, and the resist mask is obtained by exposing a positive photoresist (photosensitive resin).

As shown in the drawings, in order to form the resist mask, the positive photoresist is irradiated with light L through a mask M. An exposed region R1 is formed in the photoresist so as to correspond with the opening of the mask M, and an unexposed region R2 is formed in a portion of the photoresist covered by the mask M.

At this time, the depth of the lower layer contact hole 30 formed with the organic insulating film 26 as a mask is deep, at approximately 3 µm, for example. Thus, if the amount of light L (exposure amount) is appropriately selected, it is possible to form an unexposed region R3 in the photoresist in the vicinity of the bottom of the lower layer contact hole 30.

FIG. 7(b) shows the result of developing. The photoresists 44 are left remaining, corresponding in position to the unexposed regions R2 covered by the mask M, and a photoresist 46 corresponding to the unexposed region R3 is also left remaining in the lower layer contact hole 30 in a self-aligned manner. In this manner, using the mask M having an opening disposed so as to surround the periphery of the lower layer contact hole 30, the amount of exposure is appropriately adjusted, and thus, it is possible to also provide the photoresist 46 in the vicinity of the bottom of the lower layer contact hole 30.

FIG. 7(c) shows a state after dry etching was performed using the photoresists (resist masks) 44 and 46 shown in FIG. 7(b). The transparent conductive film 13 covered by the resist masks 44 and 46 is left remaining without being etched, and as a result, lower transparent electrodes 12 for forming auxiliary capacitance, and a connecting transparent electrode 14 formed so as to cover the bottom and a portion of the side faces of the lower layer contact hole 30 are obtained.

Figure 8:
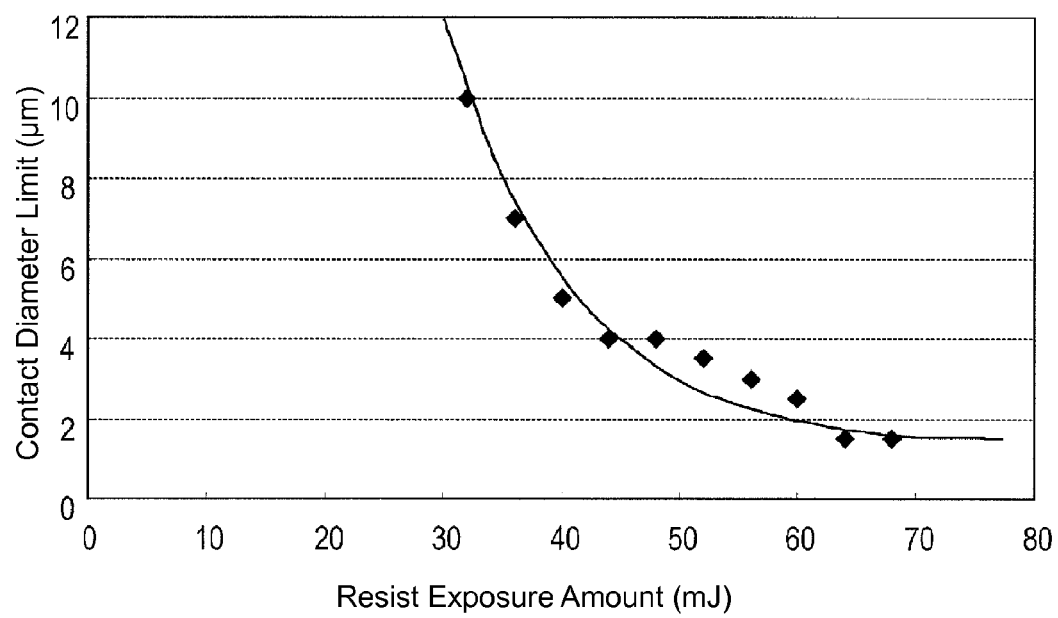
FIG. 8 shows a relation between resist exposure amounts, and the limit to diameters of contact holes that can be formed in the transparent electrode in a self-aligned manner.
Figure 9:
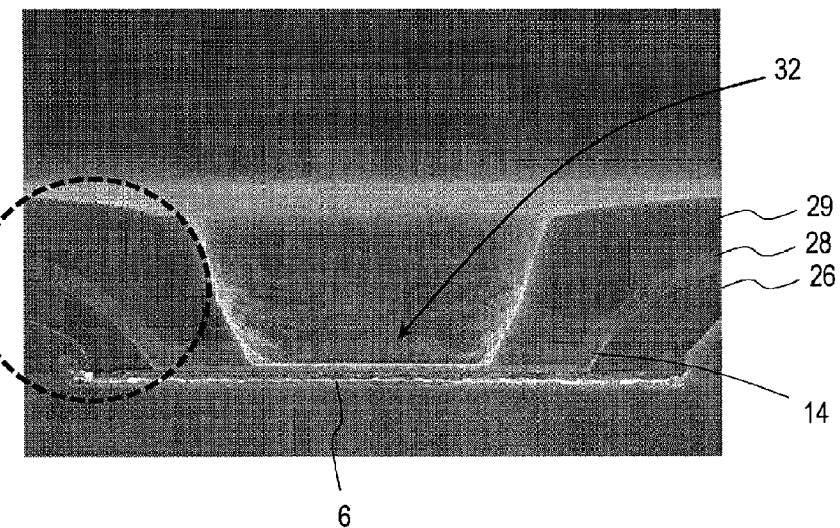
FIG. 9(a) is a cross-sectional view showing a state in which a lower layer/upper layer contact hole is formed.
FIG. 9(b) is a partial magnified view of FIG. 9(a).
Figure 9:

FIG. 8 is a graph showing a relation between the photoresist exposure amount and the limit to the diameter of the contact hole that can be formed using the resist pattern in a self-aligned manner in the contact hole.

If the amount of exposure is too little, then too much of the photoresist remains, and thus, it is difficult to form a mask pattern for forming the lower layer transparent electrodes 12 and the connecting transparent electrode 14. Thus, it is preferable that the amount of exposure be at least approximately 40 mJ.

However, in this case, as the photoresist exposure amount increases, the positive resist in the contact hole is more susceptible to being removed, and it becomes more difficult for the resist to remain in the contact hole after developing. In particular, it was found by experiment that if the exposure amount is large and the diameter of the contact hole is too large, then it is impossible to leave resist remaining in the contact hole in a self-aligned manner. The graph shows this limit to the contact diameter in relation to the exposure amount.

As can be seen from the graph, it is preferable that the resist exposure amount be at least approximately 40 mJ, and that the diameter of the lower layer contact hole 30 at the bottom surface (diameter of opening of organic insulating film 26) be at most approximately 4 µm, in order to stably leave remaining the resist mask (unexposed photoresist) in the lower layer contact hole 30 in a self-aligned manner.

FIGS. 9(a) and 9(b) show the connecting transparent electrode 14 and the lower layer transparent electrodes 12 formed in a self-aligned manner in this way, and FIG. 9(b) is a partial magnified view of the portion of FIG. 9(a) encircled by the dotted line. Also, FIGS. 9(a) and 9(b) show a state in which the upper layer contact hole 32 reaching the connecting transparent electrode 14 is formed as a result of etching the upper layer insulating film 28 using the photoresist 29. The connecting transparent electrode 14 can be formed in a self-aligned manner using the remaining photoresist in the contact hole by appropriately selecting the resist exposure amount and the diameter of the contact hole when forming the resist mask.

(Pixel Aperture Ratio)

Figure 10:
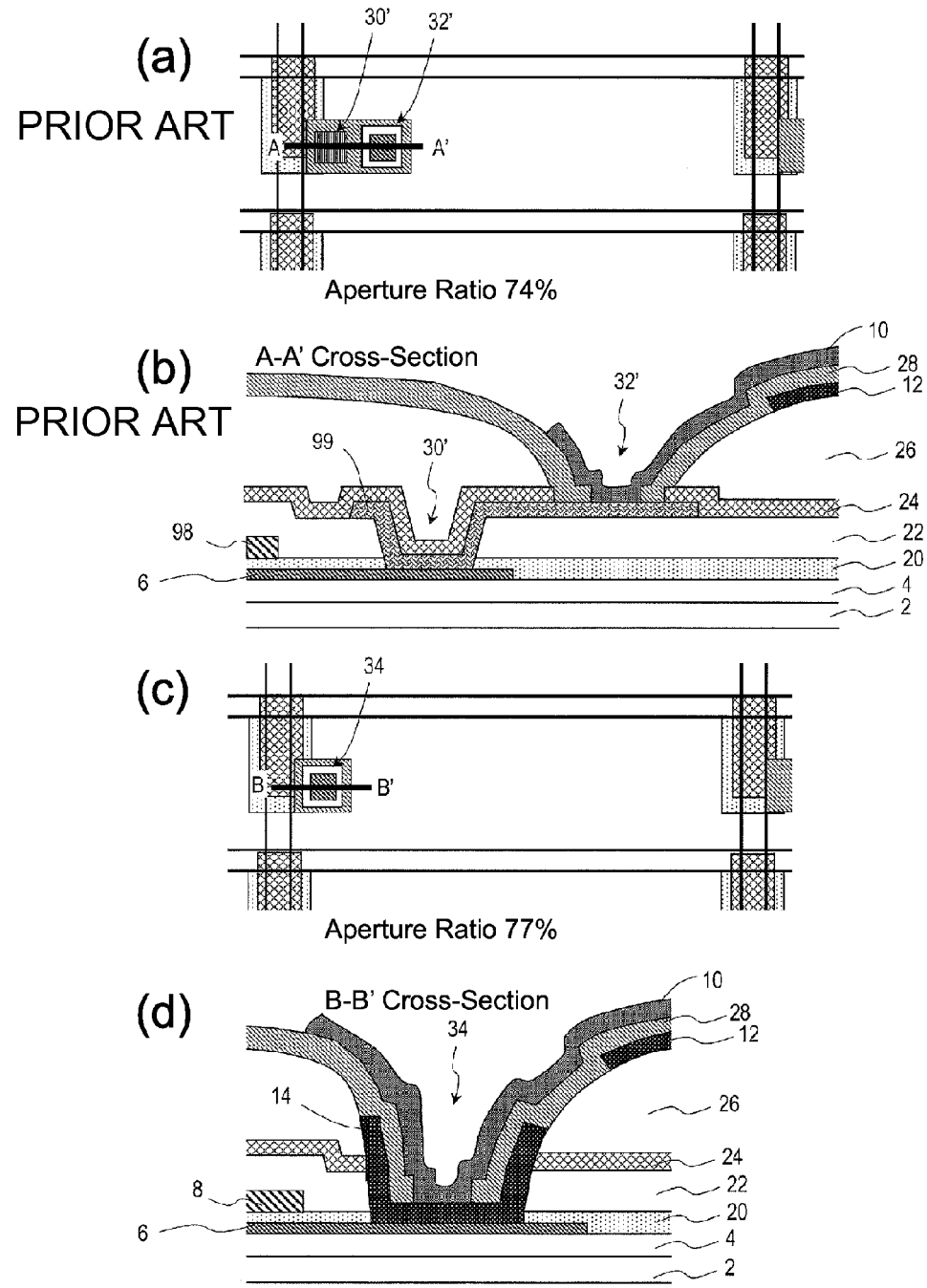
FIGS. 10(a) and 10(b) show contact holes in a conventional staggered TFT configuration.
FIGS. 10(c) and 10(d) show a contact hole in the staggered TFT configuration of an embodiment of the present invention.

Next, with reference to FIGS. 10 and 11, the pixel aperture ratio of an embodiment of the present invention and a pixel aperture ratio of a conventional configuration will be compared.

FIGS. 10(a) and 10(b) show a contact hole in a pixel on a TFT substrate having the conventional top gate-type TFTs, and FIGS. 10(c) and 10(d) show a contact hole in a pixel on a TFT substrate having top gate-type TFTs of an embodiment of the present invention.

As can be seen from FIGS. 10(a) and 10(b), in a conventional top gate-type TFT substrate, a contact hole 30' in which a semiconductor layer 6 and a drain electrode 99 are connected is provided in a different position from a contact hole 32' in which the drain electrode 99 is connected to a pixel electrode 10. As a result, the light-shielding region in the pixel increases and the pixel aperture ratio decreases. When applied to a fully high definition (FHD) mid to small panel that is 249 ppi, for example, the pixel aperture ratio was approximately 74%.

By contrast, as can be seen from FIGS. 10(c) and 10(d), in the TFT substrate of an embodiment of the present invention, the connecting transparent electrode 14 formed in the same step as the lower layer transparent electrodes 12 is provided in the contact hole 34, one contact hole 34 being sufficient, and thus, the pixel aperture ratio is improved. When applied to an FHD mid to small panel that is 249 ppi, for example, the pixel aperture ratio was approximately 77%.

FIGS. 11(a) and 11(b) show a position of a contact hole in a pixel in a TFT substrate having conventional bottom gate TFTs, and FIGS. 11(c) and 11(d) show a position of a contact hole in a pixel in a TFT substrate having bottom gate TFTs of an embodiment of the present invention.

As can be seen from FIGS. 11(a) and 11(b), in the conventional bottom gate TFT substrate, a drain electrode 99 provided so as to be connected to the semiconductor layer 6 is connected to the pixel electrode 10 in the contact hole 34' provided in a position different from where the drain electrode 99 is connected to the semiconductor layer 6. When such a configuration was applied to a 249 ppi FHD mid to small panel, for example, then the pixel aperture ratio was approximately 76%.

By contrast, as can be seen from FIGS. 11(c) and 11(d), in the TFT substrate according to an embodiment of the present invention, the connecting transparent electrode 14 formed in the same step as the lower layer transparent electrodes 12 is provided in the contact hole 34, and the drain connecting portion and the contact hole 34 overlap, and thus the pixel aperture ratio is improved. When applied to a 249 ppi FHD mid to small panel, for example, the pixel aperture ratio was approximately 81%.

Embodiments of the present invention were described above, but it is apparent that various modifications can be made. Also, the TFT substrate of the present invention is used in various display devices, and drives a display medium layer (liquid crystal layer, for example) disposed on the TFT substrate. The TFT substrate of the present invention can be suitably used not only in VA (vertical alignment) mode liquid crystal display devices, but also as an active matrix substrate of a transverse field mode liquid crystal display device such as IPS or FFS (fringe field switching).

INDUSTRIAL APPLICABILITY

The present invention is widely used as a TFT substrate in various display devices such as liquid crystal display devices.

DESCRIPTION OF REFERENCE CHARACTERS

100 TFT substrate
2 substrate
4 base coat layer
6 semiconductor layer
8 gate wiring line
9 source wiring line
10 pixel electrode
12 lower layer transparent electrode
14 connecting transparent electrode
16 upper layer transparent electrode
20 gate insulating film
22 interlayer insulating film
24 passivation film
26 organic insulating film
28 upper layer insulating film
30 lower layer contact hole (first contact hole)
32 upper layer contact hole (second contact hole)
34 contact hole

The invention claimed is:

1. A thin film transistor substrate, comprising:
a substrate;
a thin film transistor provided on the substrate;
a first insulating layer provided over the thin film transistor;
a lower layer transparent electrode provided over the first insulating layer;
a second insulating layer covering the lower layer transparent electrode; and
a pixel electrode provided on the second insulating layer,
wherein the lower layer transparent electrode, the second insulating layer, and the pixel electrode form an auxiliary capacitance,
wherein the thin film transistor and the pixel electrode are electrically connected to each other in a contact hole penetrating the first insulating layer and the second insulating layer through a connecting transparent electrode disposed in the contact hole, the connecting transparent electrode being separate from the lower layer transparent electrode,
wherein the thin film transistor includes a semiconductor layer consisting a channel, and the semiconductor layer and the contact hole are disposed so as to overlap in a direction normal to the substrate, and
wherein the semiconductor layer and the connecting transparent electrode are in direct contact with each other.

2. The thin film transistor substrate according to claim 1, wherein the connecting transparent electrode is made of the same material as the lower layer transparent electrode.

3. The thin film transistor substrate according to claim 1, wherein the contact hole includes a first contact hole formed in the first insulating layer and a second contact hole formed in the second insulating layer, and the first contact hole and the second contact hole are disposed so as to overlap in a direction normal to the substrate.

4. The thin film transistor substrate according to claim 3, wherein the connecting transparent electrode is formed on an entire bottom portion of the first contact hole.

5. The thin film transistor substrate according to claim 4, wherein the connecting transparent electrode covers a portion of a side face of the first contact hole.

6. The thin film transistor substrate according to claim 1, wherein the semiconductor layer is an oxide semiconductor made of indium, gallium, and zinc.

7. A thin film transistor substrate, comprising:
a substrate;
a thin film transistor provided on the substrte;
a first insulting layer provided over the thin film transistor;
a lower layer transparent electrode provided over the first insulting layer;
a second insulting layer covering the lower layer transparent electrode; and
a pixel electrode provided on the second insulting layer;
a display region where a plurality of said pixel electrodes are arranged, and a peripheral connecting region disposed on an outer side of the display region;
a gate wiring line and a source wiring line disposed in the peripheral connecting region, below the first insulating layer and the second insulating layer;
a gate contact hole and a source contact hole formed respectively over the gate wiring line and the source wiring line so as to penetrate the first insulating layer and the second insulating layer; and
a peripheral transparent electrode in at least the gate contact hole or the source contact hole, the peripheral transparent electrode being formed separately from the lower layer transparent electrode,
wherein the lower layer transparent electrode, the second insulting layer, and the pixel electrode form an auxiliary capacitance, and
wherein the thin film transistor and the pixel electrode are electrically connected to each other in a contact hole penetrating the first insulting layer and the second insulting layer through a connecting transparent electrode disposed in the contact hole, the connecting transparent electrode being separate from the lower layer transparent electrode.

8. The thin film transistor substrate according to claim 7, further comprising a conductive layer made of the same material as the pixel electrodes, the conductive layer connecting the gate wiring line and the source wiring line through the gate contact hole and the source contact hole.

9. A method of manufacturing a thin film transistor substrate, comprising:
preparing a substrate;
forming a thin film transistor on the substrate;
forming a first insulating layer over the thin film transistor;
forming a first contact hole in the first insulating layer;
forming a lower layer transparent electrode over the first insulating layer and forming a connecting transparent electrode made of the same material as the lower layer transparent electrode in the first contact hole so as to be separate from the lower layer transparent electrode;
forming a second insulating layer covering the lower layer transparent electrode and the connecting transparent electrode;
forming a second contact hole in the second insulating layer; and
forming a pixel electrode on the second insulating layer, wherein a drain of the thin film transistor is connected to the pixel electrode through the connecting transparent electrode, and wherein the step of forming the connecting transparent electrode comprises:

forming a transparent conductive layer covering an inside region of the first contact hole and a region outside of the first contact hole integrally;

disposing photoresist inside the first contact hole;

forming a resist mask that selectively covers only a vicinity of a bottom of the first contact hole by partially removing the photoresist inside the first contact hole; and forming the connecting transparent electrode by partially removing the transparent conductive layer using the resist mask.

10. The method of manufacturing a thin film transistor substrate according to claim 9, wherein the photoresist is a positive photoresist, wherein the step of disposing the photoresist inside the first contact hole includes a step of disposing a photoresist layer that integrally covers the region inside the first contact hole and the region outside of the first contact hole, wherein the step of forming the resist mask comprises:

disposing a mask having an opening that overlaps the first contact hole at least partially over the photoresist layer; and exposure and developing in which the photoresist inside the first contact hole in the photoresist layer is partially exposed through the opening in the mask, and in which the exposed photoresist is removed by developing, and wherein in the step of exposure and developing, exposure is performed at a selected exposure amount such that only photoresist in a vicinity of a bottom of the contact hole, among the photoresist inside the first contact hole, remains after developing.

* * * * *